United States Patent [19]
Wollmann et al.

[11] Patent Number: 4,723,799
[45] Date of Patent: Feb. 9, 1988

[54] WAFER CARRIER TRANSPORT SYSTEM INTERFACE

[75] Inventors: Andrew F. Wollmann, Scottsdale; Donald A. Wessel, Mesa, both of Ariz.

[73] Assignee: Wollmann Engineering, Inc., Tempe, Ariz.

[21] Appl. No.: 775,619

[22] Filed: Sep. 13, 1985

[51] Int. Cl.$^4$ ............................................. B65D 25/28
[52] U.S. Cl. ...................................... 294/1.1; 294/16; 294/68.1
[58] Field of Search ............... 294/16, 1.1, 68.1, 26.5, 294/27.1, 31.2, 87.1, 34, 172; 206/328, 316, 445, 334

[56] References Cited
U.S. PATENT DOCUMENTS 3,923,191 12/1975 Johnson ................................. 294/16
4,195,871 4/1980 Chilton et al. ........................ 294/16

Primary Examiner—James B. Marbert
Attorney, Agent, or Firm—M. David Shapiro

[57] ABSTRACT

The invention comprises a two, three or four short pin engagement system for engaging a wafer carrier for transporting semiconductor wafers by means of a three axis robotic transportation system for the purpose of processing semiconductor wafers in a factory. The multiple pin assembly allows a large reduction in travel distance with respect to prior art long rod engagement supports.

16 Claims, 9 Drawing Figures

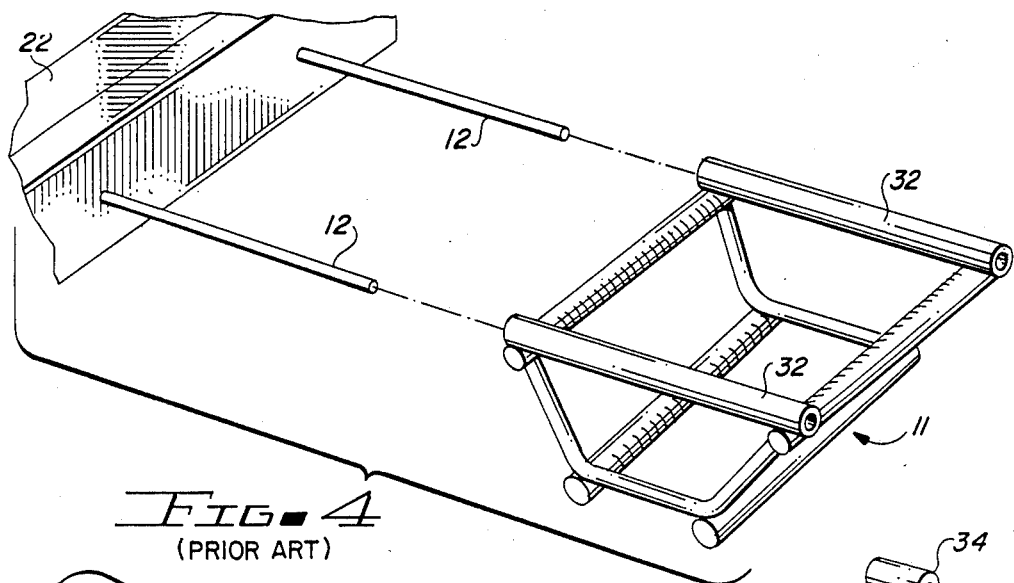
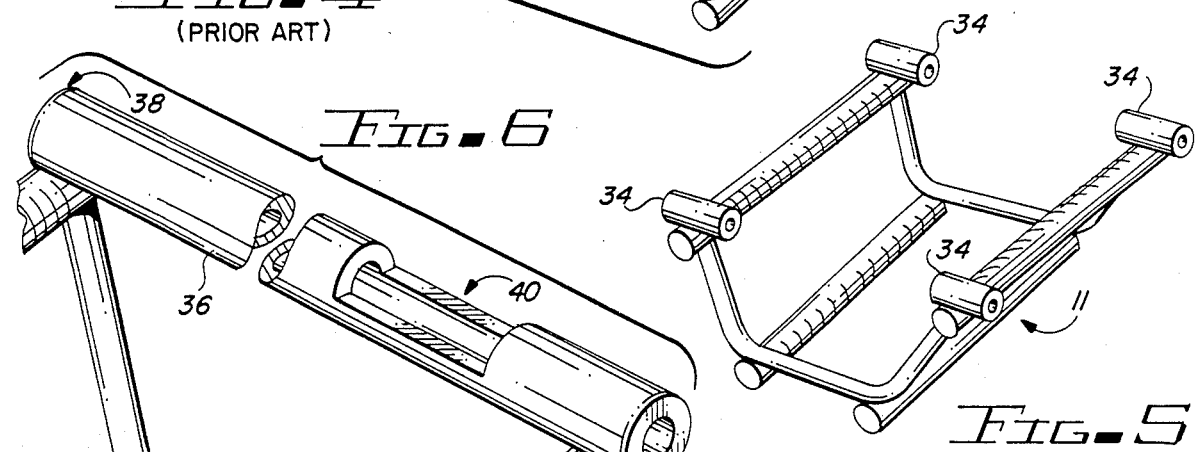
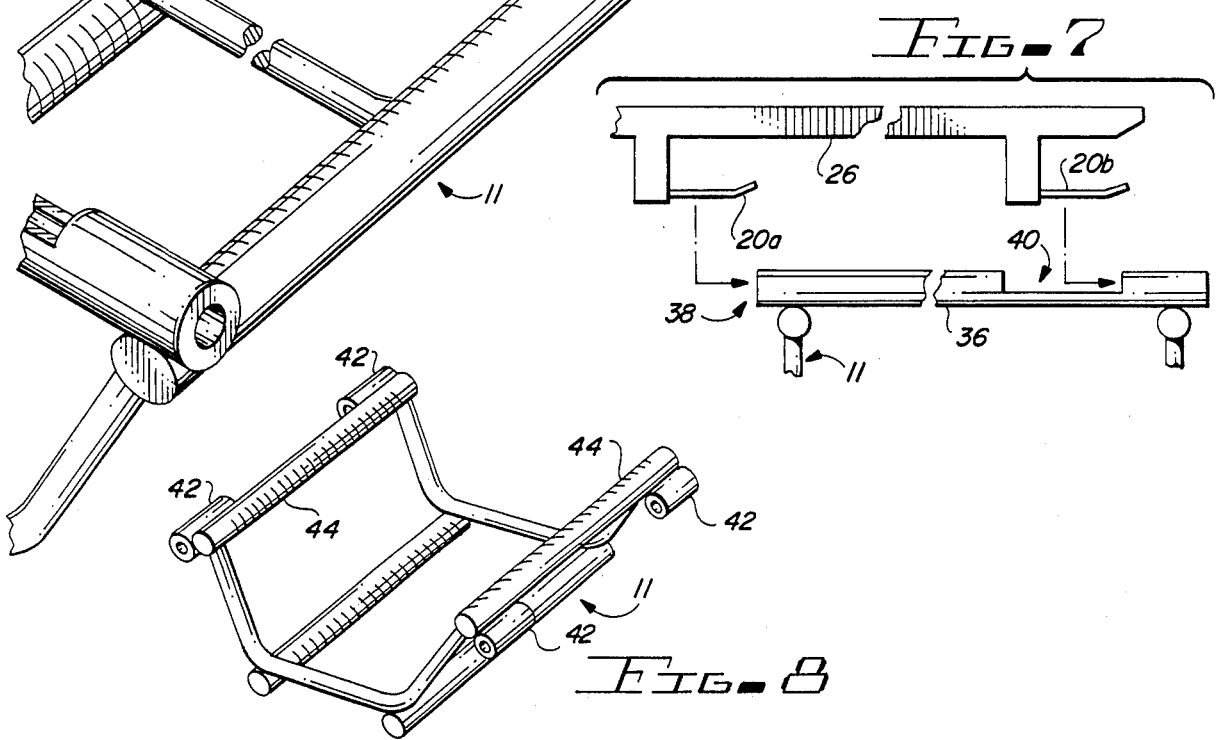

WAFER CARRIER TRANSPORT SYSTEM INTERFACE

FIELD OF THE INVENTION

The invention relates to a system for transporting wafer carrier cassettes and boats by means of an improved mechanical interface between a robotic transport system and the wafer carriers which provides a significant reduction in travel distance for engagement and disengagement.

BACKGROUND OF THE INVENTION

Cassettes and boats are used as wafer carriers to transport semiconductor wafers in the various processes involved in the manufacture of said semiconductor wafers. Where low temperature processes are involved, it is common practice to use plastic or other lower cost wafer carriers and where high temperature processes must be endured, quartz or other high temperature materials are used. The lower cost plastic carriers are more "friendly" to the wafers in that they are softer and protect the wafers better against physical damage. This is especially true where the wafers are subjected to washing and cleaning processing cycles.

"Cassette to cassette" systems involve more than one kind of wafer carrier, for example, teflon carriers may be used for washing or cleaning operations and quartz boats may be used for oven processing. Other materials are also used for wafer carrier fabrication, depending upon the particular application.

Transfer machines are used to transfer wafers from one carrier type to another and back again. The transfer machine handles the wafers in lots of, say, twenty-five, removing them from one carrier, while a human operator manually removes the input carrier and replaces it with the output carrier, and then replacing them in the output carrier.

Of course it is advantageous to eliminate the human handling function because of the possibility of wafer or carrier breakage with its attendant high cost and because manufacturing efficiency is better served if the human operator is not required. Furthermore, in many oven systems, it is necessary to locate the boat in the oven input area with some precision.

Until recently, there were no three axis robotic systems that had the accuracy and repeatability which would allow such cassette to cassette operations to be automated. With the advent of a relatively low cost, high resolution three axis robotic system which is capable of extreme accuracy, high speed and programmable track, velocity and acceleration characteristics, such as the Model CCR 3000 manufactured and sold by Wollmann Engineering, Inc., 202 South River Drive, Tempe, Arizona 85281, it has become economically and physically feasible to handle and transport wafer carriers with a high degree of accuracy, speed and safety. The CCR 3000 is specified at a useful accuracy of plus or minus 0.004 inches (measured performance is even better) which allows the use of tight tolerance engagement and pick up interfaces.

FIG. 1 shows prior art wafer carrier 10 of a plastic type as manufactured by Fluoroware, 102 Jonathon Boulevard, Chaska, Minnesota 55318. A parallel two rod 12 pickup mechanism of prior art design is inserted into slots 14a and 14b to engage carrier 10. Rods 12 must be relatively small in diameter to fit within the space provided by slots 14. Because of the small diameter of rods 12, they are not as structurally stiff as might be desired. Note that engagement travel 16 of pickup rods 12 must be equal to or greater than the length of rods 12. This necessarily long travel distance represents longer operating time and higher cost. Furthermore, the engagement travel is in the z-axis of the three axis robot which drives the engaging mechanism. The z-axis travels horizontally and perpendicular to the loading station (parallel to the wafers) and intrudes upon an operator work and walk area in front of the loading area.

Since the entire mechanism is in a very costly clean room environment, it is important that no excessive use of floor area be consumed by the robot operation. That means that the more the z-axis arm intrudes into the work area, the more danger there is that an operator may be injured by the robot z-axis arm or that the operator will jostle the robot arm and cause damage to wafers, carriers or both. A carrier loaded with wafers may be worth many thousands of dollars. Damage to such a load can be very costly.

Furthermore, the clean room represents very expensive floor space because of the extreme costs of maintaining its purity. Any excursion of the z-axis arm beyond the footprint of the loading station represents an additional volume which must be provided and maintained as a clean environment. For that reason, it is especially advantageous to minimize the excursion of the z-axis robot arm outside of the loading station.

SUMMARY OF THE INVENTION

The foregoing and other problems associated with prior art mechanical interfaces of robot systems with wafer carriers are resolved by means of features of the instant invention. By replacing the long rods, which prior art systems employ to engage the wafer carriers, with the four pin pick up system of the invention, travel distance and the resulting travel time for engagement and disengagement of the robotic system and the carrier is much reduced. As a result, clean room volume is conserved and operational safety is improved.

It is, therefore, an object of the invention to significantly reduce the travel distance required on the z-axis of a three axis robotic wafer loading system by means of a short pin pick up or engagement/disengagement system.

It is another object of the invention to reduce the footprint of the loading station associated with a semiconductor oven by means of the use of a short pin pick up or engagement/disengagement system on a three axis robotic wafer loading system.

It is still another object of the invention to reduce the safety problems of prior art three axis robotic loading systems by means of the use of a short pin pick up or engagement/disengagement system.

It is yet another object of the invention to reduce the probability of damage to the wafer carriers and wafers carried on a three axis robotic loading system by means of the use of a short pin pick up or engagement/disengagement system.

It is a further object of the invention to provide longitudinal pick up points on a wafer carrier to allow engagement of those pick up points by means of a short pin pick up or engagement/disengagement system.

It is a still further object of the invention to provide an engagement ssystem which is capable of a higher degree of structural integrity than that of the prior art.

These and other objects of the invention will be more readily understood upon review of the Detailed Description of the Preferred Embodiment of the Invention, below, together with the drawings in which:

FIG. 4 is a perspective view illustrative of a prior art long rod mechanical interface about to engage a quartz boat;

FIG. 5 is a modified version of the quartz boat of FIG. 4 using four short quartz tubes for engagement by the four pin pick up system of the invention;

FIG. 6 is a perspective view of a slotted tube version of the quartz boat of FIG. 5;

FIG. 7 is a side elevation view of the quartz boat of FIG. 6 with the four pin pick up in close proximity; and FIG. 8 is a perpective view of the quartz boat of FIG. 4 as modified with four short tubes mounted longitudinally.

DETAILED DESCRIPTION OF THE PREFERRED EMBODIMENT OF THE INVENTION

Figure 2:
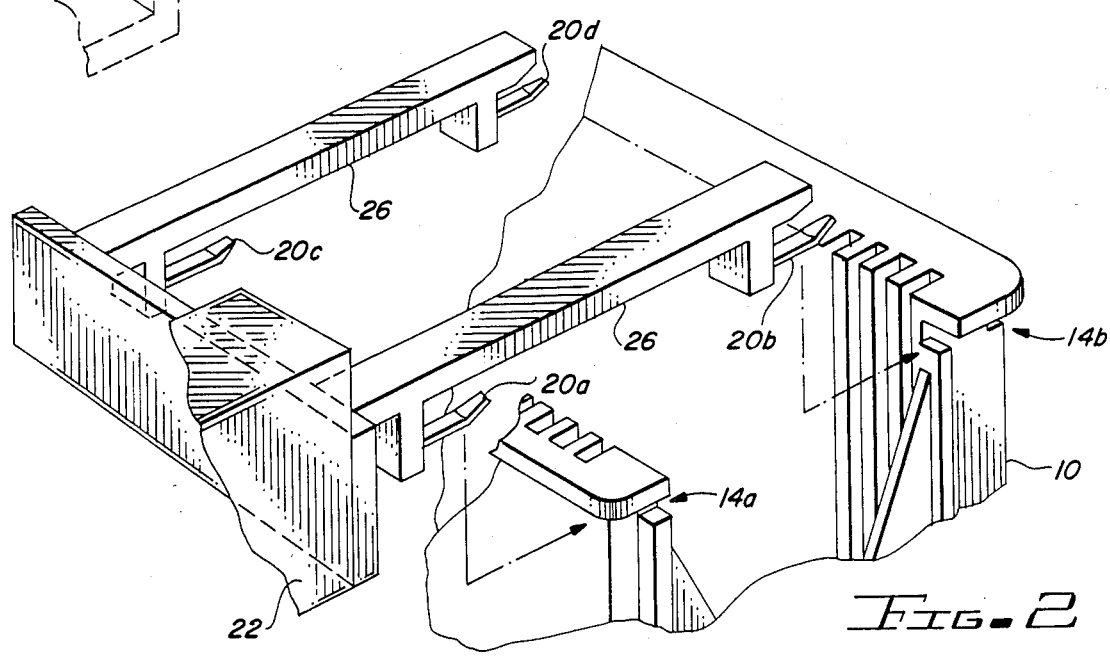
FIG. 2 is a perspective drawing of the four pin pick up system of the invention in close proximity to a prior art plastic wafer carrier.

The preferred embodiment of the invention is shown fully in FIGS. 2, 3, and 7. First, observing FIG. 2, it may be seen that pins 20 are positioned to engage slots 14 (pin 20a into slot 14a, pin 20b into slot 14b, etc.) of wafer carrier 10. Carrier 10 may be a plastic wafer carrier made of teflon or polypropylene or some other suitable material. Such wafer carriers may be procured from Fluoroware (see, supra) and other manufacturers.

Pins 20 may be made of small diameter stainless steel, teflon coated stainless steel or other materials such as silicon carbide, depending upon the requirements of the particular operation. Because pins 20 are part of assembly 26, assembly 26 may be of a heavier structure to provide a higher degree of structural stiffness than the smaller diameter rods 12 (see FIG. 1). The body of assembly 26 may be made of aluminum or other suitable material. Pins 20 may be of small diameter to fit slots 14 but their load, wafer carrier 10, is not cantilevered so far away from the anchored ends of pins 20, therefore, it may be seen that structure 26 contributes greatly to the improved structural ability of the system by providing a much stiffer support for wafer carrier 10. Assembly 26 is configured to match its pins 20 with slots 14 of the wafer carrier. Pins 20 have turned up end portions 10e to prevent wafer carrier 10 from moving on pins 20, once engaged.

Figure 1:
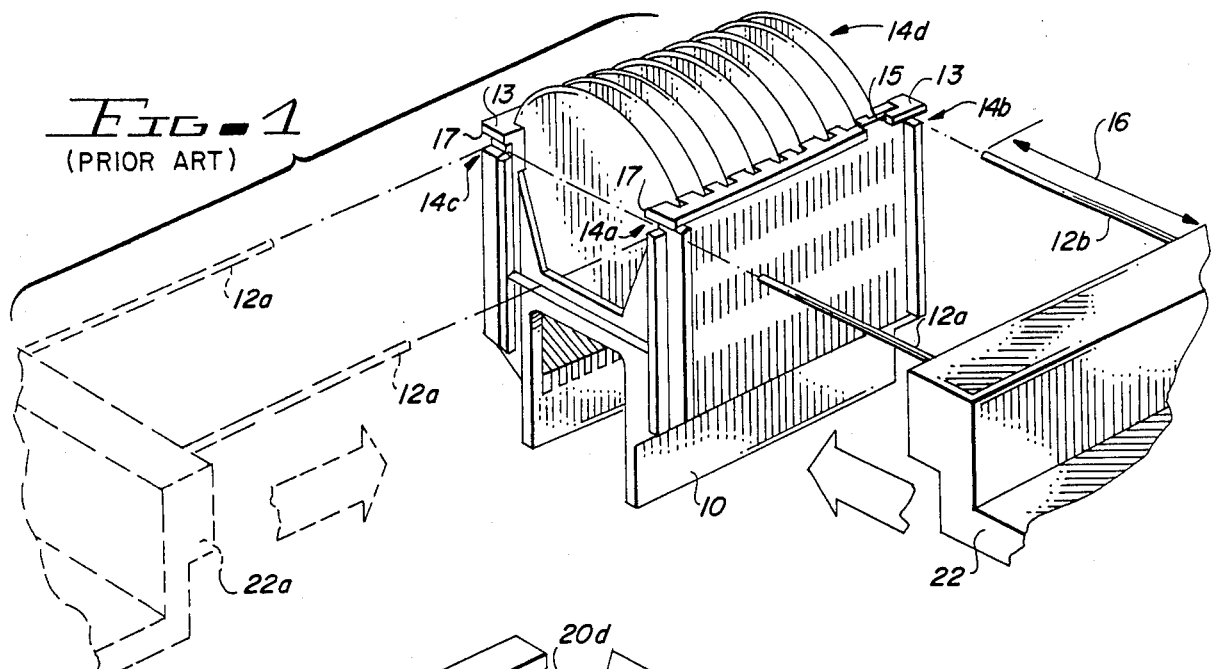
FIG. 1 is a perspective drawing of a prior art pick up system utilizing two long pick up rods for engagement of a typical plastic wafer carrier, two approach directions being shown.
Figure 3A:
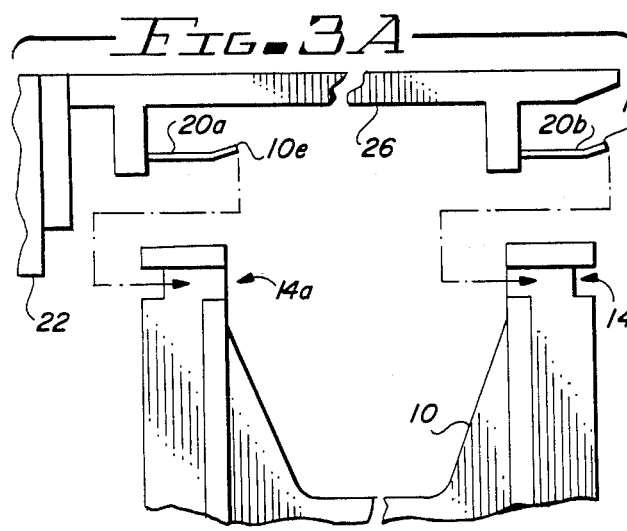
FIG. 3A is a side elevation view of the four pin pick up and wafer carrier as illustrated in FIG. 2.
Figure 3B:
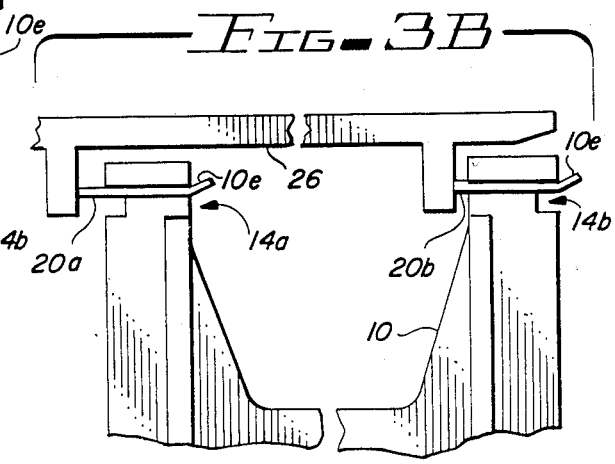
FIG. 3B is a side elevation view of the four pin pick up and wafer carrier as in FIG. 3A, but showing the four pins engaged in the wafer carrier.

FIG. 3A is a side view of the pick up system of FIG. 2 and more clearly shows that the total travel distance of pins 20 is very short compared to the engagement-/disengagement travel of prior art rods 12 of FIG. 1. FIG. 3B is a side elevation of the system of FIGS. 2 and 3A but is illustrative of the fully engaged position of pins 20 in slots 14 of wafer carrier 10. As shown in FIGS. 3A and 3B, pins 20 must be displaced downward by z-axis arm 22 of the three axis robotic system (not shown) and then to the right in order to fully engage respective slots 14 of wafer carrier 10. Of course, the travel is reversed for disengagement.

It will be understood that plastic wafer carriers may not be used to insert wafers into a hot oven; the plastic would disintegrate at the high temperatures. Therefore, it is typical practice to remove the wafers from plastic wafer carriers such as that shown at 10 and, by means of a wafer transfer machine, transfer them to, for example, a prior art quartz boat 11 such as is shown in FIG. 4. These prior art boats 11 are typically handled by engagement with two long rods 12 which are inserted into quartz tubes 32. Tubes 32 also serve a structural function in quartz boat 11. It will be noted that the travel distance of rods 12 of FIG. 4 is analagous to that of rods 12 in FIG. 1.

FIG. 5 shows a modification of the prior art quartz boat 11 which comprises four short lengths of quartz tubing 34 located on each upper corner of the quartz boat 11 and each is oriented so that its axis is parallel to the wafers to be contained by quartz boat 11, as shown. Short tubing 34 is located on the quartz boat 11 so that pins 20 of assembly 26 of the invention (see FIGS. 2, 3A and 3B) will mate and engage with the inner portion of respective tube sections 34.

FIG. 6 shows a variation on the short tube sections 34 of FIG. 5 which may be used when the structural integrity of a single cross member is of advantage. Tubes 36 are placed across each end of quartz boat 11 with the inboard pins 20a and 20c engaging open near end 38 of slotted tube 36. Pins 20b and 20d engage the inner surface of tube 36 through slots 40. The engagement action is identical to that explained, supra, for the flanged plastic wafer carrier 10 of FIG. 2. FIG. 7 is a side view of the slotted tube version of the quartz boat which clearly shows the similarity of the engagement action just mentioned.

A variation on the slotted tube approach would utilize a single slot positioned so that one end of the slot is close to the centerline of the boat. This would allow a single pin to be used to engage a single engagement surface centered on the centerline of the quartz boat. It is clear that, in that case, stability of the engagement will be a function of the engagement pin length. The longer the pin, the greater the stability. However, it is believed that if the length of the engagement pin becomes more than about 50% of the parallel dimension of the boat or wafer carrier, the travel distance becomes too great; that is, the travel distance begins to approach the travel distance of prior art long rods 12 shown in FIG. 1 and much of the benefit of using a short engagement pin would not be realized.

It should also be recognized that a similar situation may be realized with wafer carriers made of other materials. Almost all plastic wafer carriers have flanges at their upper edges. A well located slot near the center of such a flange would provide the same clearance for a single centered engagement pin (on each side of the parallel sides of the wafer carrier) as would the slotted tube discussed, above. Such a slot would appear to be much the same as slot 15 of FIG. 1. Where there is no flange on an end of the wafer carrier (for example, see FIG. 1), a flange or a flange substitute would have to be added.

In some applications, it may be desirable to engage the wafer carrier parallel to the axis of the wafers intended to be held therein. This prior art configuratution is illustrated in FIG. 1 (in the phantom view of assembly 26 and rods 12) for the case where long rods 12 are employed to engage the underside of flanges 13 of wafer carrier 10. Some prior art plastic wafer carriers have a slot 15 in each of flanges 13 (see FIG. 1) which would allow pins 20 of assembly 26 to engage the flanges in the longitudinal direction (parallel to the axis of the wafers held by carrier 10). It is believed that slots 15 are provided in prior art wafer carriers as part of a system for picking up the carrier at its end. In the instant case, one set of pins 20 (pins 20a and 20c, see FIG. 2) would engage at ends 17 of flanges 13 and enter such engagement from that end of the flanges. The other pair of pins 20 (pins 20b and 20d) would enter engagement of the far end of flange 13 through slots 15 (see FIG. 2). While the engagement is not shown, it is clear that assembly 26 of FIG. 2 may be arranged to engage the flanges 13, as described in this paragraph.

FIG. 8 shows another modified quartz boat 11 with four short tube lengths incorporated thereon to accept pins 20 of assembly 26 (see FIG. 2) in the same manner as that described above for plastic wafer carriers; that is, with pins 20 parallel to the axis of wafers to be held on the boat. Short tube sections 42 are attached to and parallel to the extremeties of longitudinal members 44. Short tube sections 42 should be outboard of an envelope determined by the wafers to be held in the boat so that assembly 26 has enough clearance around the wafers. Of course, it will be understood that assembly 26 might be modified so that pins 20 are supported by the rest of assembly 26 in a single plane or from some other angle that would provide the necessary clearance of the wafers during engagement and disengagement.

As in the case of plastic wafer carrier 10 as described, supra, assembly 26 may be rotated ninety degrees on z-axis arm 22 of the three axis robotic system so that pins 20 are parallel to the axis of the wafers held in the modified quartz boat 11. Tubes 42 are engaged by assembly 26 in much the same way as short tube sections 34, shown in FIG. 5, except that the engagement is made parallel to the axis of the wafers rather than parallel to the surface of the wafers as was shown in FIG. 5.

And, finally, it is clear that short tubes 42 could be replaced by a slotted tube similar to tube 36 of FIGS. 6 and 7, but arranged longitudinally (parallel to the wafer axis) on the quartz boat 11 of FIG. 8. In some cases, that longitudinal slotted tube would perform the structural function of longitudinal tube 44 of FIG. 8 as well as the wafer holding function and the interface function.

While the invention has been particularly shown and described herein with reference to a preferred embodiment thereof, it will be understood by those skilled in the art that various other modifications and changes may be made to the present invention from the principles of the invention desribed above without departing from the spirit and scope thereof as encompassed in the accompanying claims. Therefore, it is intended in the appended claims to cover all such equivalent variations as may come within the scope of the invention as described.

What is claimed is:

1. An improved mechanical interface system for use on the output arm of a multiple axis robotic system for engaging and moving wafer carriers, whether or not the wafer carriers are loaded with a plurality of wafers, and a cooperating wafer carrier for carrying a plurality of semiconductor wafers, the system comprising in combination:

at least two cantilevered engagement pins, each of said pins having a distal and a proximal end, each of said cantilevered engagement pins being cantilivered so that said distal end of each of said pins is oriented in a single direction from said proximal end, each of said at least two engagement pins being significantly shorter than a corresponding side of the cooperating wafer carrier;

at least two means for engagement by said at least two engagement pins, said at least two engagement means being of the same quantity and relative location, said at least two engagement means being mounted on the cooperating wafer carrier and at least one of said at least two engagement means being mounted on an opposite side of the wafer carrier from another of said at least two engagement means, said at least two engagement means being located outside of an envelope created by the plurality of wafers when such wafers are carried by the wafer carrier; and assembly means for positioning said at least two engagement pins and for attachment of said assembly means to a drive system.

2. The improved mechanical interface system according to claim 1 wherein each of said at least two engagement means and said at least two engagement pins are equal to the quantity two.

3. The improved mechanical interface system according to claim 2 wherein each of said at least two engagement means are located at a center of a side of the wafer carrier.

4. The improved mechanical interface system according to claim 2 wherein the wafer carrier has four corners and each of said at least two engagement means are located at a pair of diagonal opposites of said four corners.

5. The improved mechanical interface system according to claim 1 wherein each of said at least two engagement means and said at least two engagement pins are equal to the quantity three.

6. The improved mechanical interface system according to claim 5 wherein the cooperating wafer carrier has four corners and one of said three engagement means is located approximately on a oenter of a first side of the wafer carrier and another two of said engagement means are located on an opposite side from said first side and approximately at two of said corners of the wafer carrier.

7. The improved mechanical interface system according to claim 1 wherein each of said at least two engagement means and said at least two engagement pins are equal to the quantity four.

8. The improved mechanical interface system according to claim 7 wherein the cooperating wafer carrier has four corners and said four enagement means are located approximately at said four corners of the cooperating wafer carrier.

9. The improved mechanical interface system according to claim 1 wherein a maximum length of each of said at least two engagement pins is no more than fifty percent of a parallel side length of the cooperating wafer carrier.

10. The improved mechanical interface system according to claim 2 wherein a maximum length of each of said at least two engagement pins is no more than fifty percent of a parallel side length of the cooperating wafer carrier.

11. The improved mechanical interface system according to claim 3 wherein a maximum length of each of said at least two engagement pins is no more than fifty percent of a parallel side length of the cooperating wafer carrier.

12. The improved mechanical interface system according to claim 4 wherein a maximum length of each of said at least two engagement pins is no more than fifty percent of a parallel side length of the cooperating wafer carrier.

13. The improved mechanical interface system according to claim 5 wherein a maximum length of each of said at least two engagement pins is no more than fifty percent of a parallel side length of the cooperating wafer carrier.

14. The improved mechanical interface system according to claim 6 wherein a maximum length of each of said at least two engagement pins is no more than fifty percent of a parallel side length of the cooperating wafer carrier.

15. The improved mechanical interface system according to claim 7 wherein a maximum length of each of said at least two engagement pins is no more than fifty percent of a parallel side length of the cooperating wafer carrier.

16. The improved mechanical interface system according to claim 8 wherein a maximum length of each of said at least two engagement pins is no more than fifty percent of a parallel side length of the cooperating wafer carrier.

* * * * *